United States Patent
Cheng

(10) Patent No.: US 7,525,800 B1
(45) Date of Patent: Apr. 28, 2009

(54) FIXING FRAME

(75) Inventor: Kuei-Hua Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 54 days.

(21) Appl. No.: 11/939,957

(22) Filed: Nov. 14, 2007

(51) Int. Cl.
*H05K 7/20* (2006.01)
*F04D 19/02* (2006.01)

(52) U.S. Cl. ............ 361/695; 361/694; 174/15.1; 415/213.1; 415/214.1; 416/244 R; 416/247 R; 165/80.1; 165/121

(58) Field of Classification Search .......... 361/687, 361/690–697, 715, 719, 721–727, 732, 740, 361/756, 802; 165/59, 80.1, 80.2, 80.3, 104.33, 165/104.34, 121–126, 185; 174/15.1, 16.1; 257/712, 718, 719, 722, 727; 248/316.1, 248/316.7, 27.1, 27.3, 505, 510; 211/41.17; 24/453, 457, 615, 625; 415/119, 176–178, 415/213.1, 214.1; 416/178, 244 R, 247 R; 417/415, 423
See application file for complete search history.

(56) References Cited

U.S. PATENT DOCUMENTS 6,611,427 B1 * 8/2003 Liao ............................ 361/695
7,251,135 B2 * 7/2007 Crippen et al. ............... 361/695

* cited by examiner

*Primary Examiner*—Michael V Datskovskiy
(74) *Attorney, Agent, or Firm*—Morris, Manning & Martin LLP; Tim Tingkang Xia

(57) ABSTRACT

A fixing frame is used to fix at least one heat sink fan on a case of an electronic device. The fixing frame includes a cradle and at least one fastener. The cradle has two oppositely disposed plates, and the two plates respectively have a combining portion and a latching portion, such that at least one accommodation region is partitioned from the cradle for accommodating the fan, and the latching portion and the combining portion are combined with each other to form a clamping region. The fastener is disposed on the case and clamped in the clamping region, such that the cradle is fixed on the case.

10 Claims, 4 Drawing Sheets

FIXING FRAME

BACKGROUND OF THE INVENTION

1. Field of Invention

The present invention relates to a fixing frame. More particularly, the present invention relates to a fixing frame for fixing at least one heat sink fan in an electronic device.

2. Related Art

Recently, with rapid development of electronic science and technology, and in order to satisfy consumers' requirements on data processing speed, operation speed of electronic components in the computer device must be quick. Volume of the electronic components is slight, such that thermal generation amount of a unit area is increased. If thermal energy cannot be dissipated in time, over high temperature will seriously affect stability and efficiency of the electronic components during operation, such that service life of the computer device is shortened, and even the computer device is damaged.

In order to quickly dissipate the thermal energy generated by the electronic components, a conventional thermal dissipating manner is installing a heat sink fan in the computer devices, so as to blow a forced air flow to the electronic components with high thermal energy for dissipation, and to lower environmental temperature in the computer device.

Four corners of the conventional heat sink fan are disposed a fixing hole respectively, and the heat sink fan is locked on the computer case by passing locking components, such as screw bolts, through the fixing holes. Alternatively, the fan is sleeved on a frame fixed on the case, such that the fan is fixed and retained at the thermal dissipating position.

However, during the assembling process or the maintaining process of the heat sink fan, the user must repeatedly assemble and disassemble the screw bolts or the frame. The process is quite time-consuming and complex. When it intends to maintain and replace the heat sink fan, it is necessary to stop the operation of the computer device, and to disassemble the whole heat sink fan, thus being quite inconvenient.

The size of the conventional fan frame is mostly suitable for specific fan types, and if it intends to replace the heat sink fans with different sizes, a matching frame must be rearranged. The volume of the frame is over huge, the space in the computer is greatly occupied if a plurality of frames is installed and used at the same time, which does not accord with the recent trend that the computer device must be light, thin, short, and small.

Further, in order to have a certain structural strength, the fan frame is mostly made of rigid material. The heat sink fan directly contacts with the frame for fixing. The shocking energy generated during the operation of the fan and the frame are quite easy to affect with each other to generate resonance, and because of the resonance frequency of the space in the computer device, the generated resonance noise is quite serious. The fan tends to be impacted due to the resonance with the frame, thereby shortening the service life of the fan.

SUMMARY OF THE INVENTION

In view of the above problem, the present invention provides a fixing frame, so as to solve the problems of the conventional art that the assembling and the disassembling processes of the heat sink fan are complex, size of the fan and the frame are not matched, and the conventional frame has no shock absorption design, thereby resulting in over high manufacturing cost, insufficient fixing stability, and large noise generated during operation.

The fixing frame of the present invention is used to fix at least one heat sink fan on a case of an electronic device. The fixing frame includes a cradle and at least one fastener. The cradle has two plates disposed oppositely and spaced by a distance. A combining portion is disposed at one side of one of the plates, and a latching portion is disposed at one side of the other plate, such that at least one accommodation region is partitioned from the cradle for accommodating the heat sink fan. The latching portion and the combining portion are combined with each other to form a clamping region. The fastener is fixed on the case and is clamped in the clamping region, such that the cradle is fixed on the case.

In the present invention, the accommodation region and the clamping region are partitioned by the combining portion and the latching portion in the fixing frame, for accommodating and fixing the heat sink fan in the bracket. Further, in the bracket, the heat sink fan is directly fixed on the case through the clamping and fixing between the clamping region and the fastener, thereby greatly saving the assembling and disassembling time and steps for the heat sink fan.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The fixing frame of the present invention is disposed in an electronic device which likes a computer device, such as a desktop computer, a notebook computer, or a server, but not limit to the above-mentioned electronic devices. In the detailed description of the present invention as follows, the server is used as the most preferred embodiment of the present invention. However, the accompanying drawings are only used to provide reference and illustration, and are not used to limit the present invention.

Figure 1:
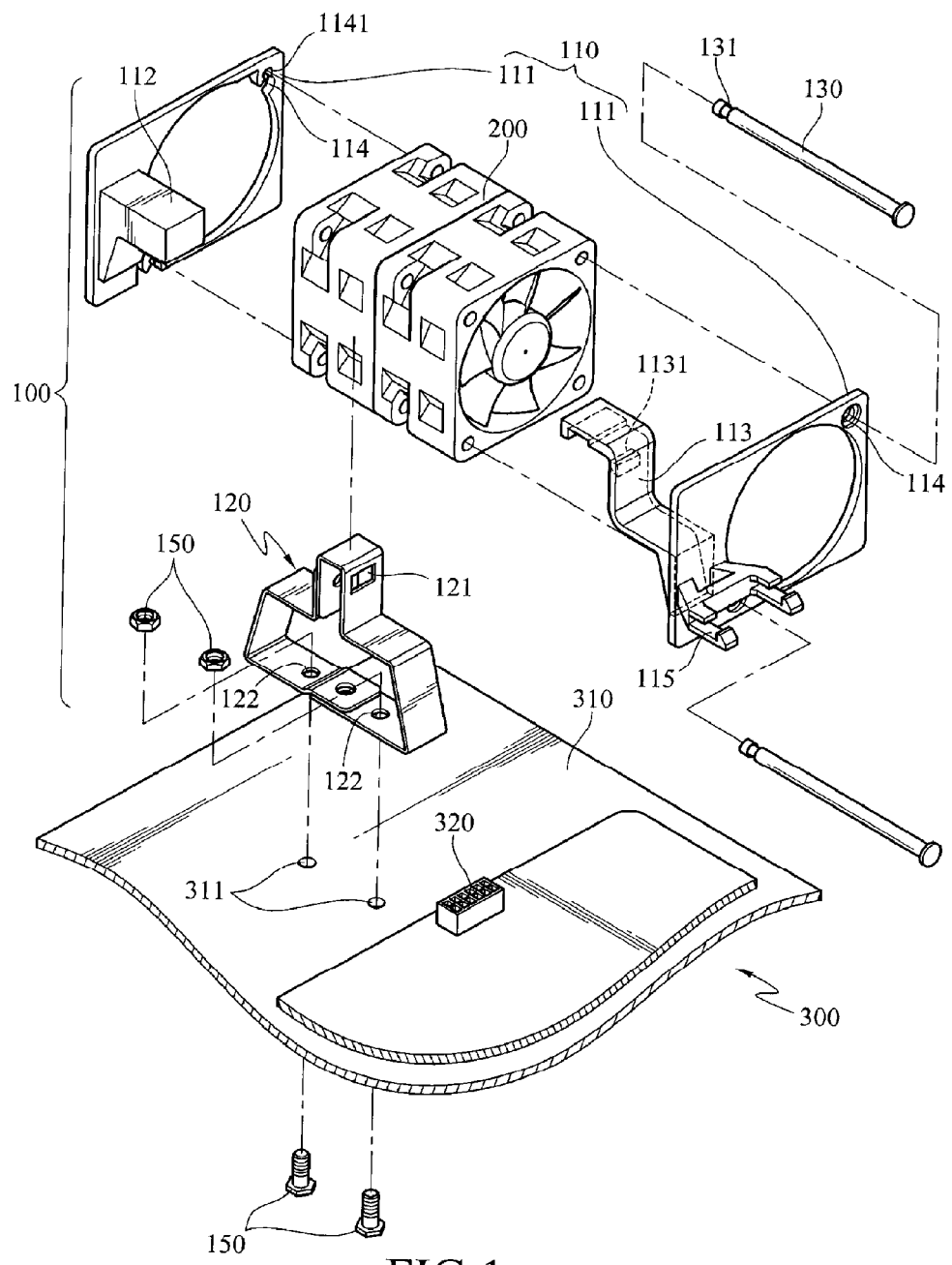
FIG. 1 is an exploded view of a first embodiment of the present invention.
Figure 2:
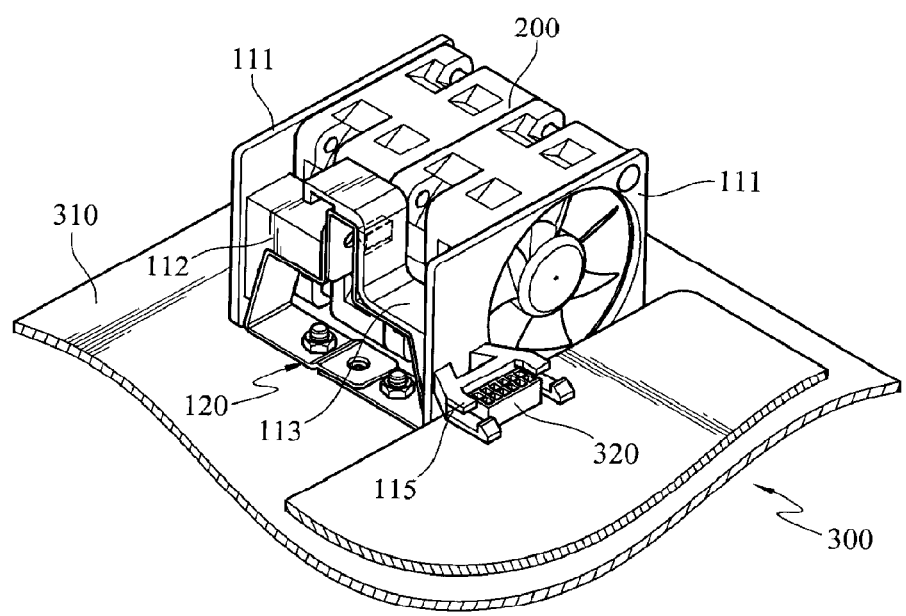
FIG. 2 is a perspective view of the first embodiment of the present invention.

FIGS. 1 and 2 are perspective views of a first embodiment of the present invention. A fixing frame 100 of the present invention is used for fixing a heat sink fan 200 on a case 310 of an electronic device 300. The fixing frame 100 includes a cradle 110 and a fastener 120. The cradle 110 has two plates 111 disposed oppositely and spaced by a distance. A combining portion 112 extends on a side of one of the plates 111, a latching portion 113 is disposed on a side of the other plate 111 that corresponding to the combining portion 112, and the latching portion 113 has a hook 1131. The combining portion 112 and the latching portion 113 are combined with each other, such that an accommodation region is partitioned from the cradle 110 for accommodating the heat sink fan 200 in the cradle 110, and a clamping region is formed between the combining portion 112 and the latching portion 113.

The combining portion 112, the latching portion 113, and the plates 111 of the present invention are formed into one piece. However, those skilled in the art may dispose the combining portion 112 and the latching portion 113 on the two plates 111 by means of buckling, riveting, welding, or other manners, which is not limited by this embodiment.

A plurality of locking holes 122 is opened at the bottom of the fastener 120, and a plurality of fixing holes 311 is opened on the case 310. By penetrating a plurality of locking elements 150, such as screw bolts, through the locking holes 122 to be locked in the fixing holes 311, the fastener 120 is secured on the case 310 of the electronic device 300. The external structure of the fastener 120 matches with the clamping region formed by the combining portion 112 and the latching portion 113. A buckling hole 121 is disposed at one side of the fastener 120. When the cradle 110 with the installed heat sink fan 200 is disposed on the case 310, the clamping region of the cradle 110 and the fastener 120 clamp with each other, and the hook 1131 is buckled with the buckling hole 121, such that the fastener 120 is fixed in the clamping region, thereby avoiding the cradle 110 from loosing or dislocating.

Please refer to FIGS. 1 and 2, the heat sink fan 200 is fixed in the cradle 110 by penetrating pins 130 through the two plates 111 and the heating sink fan 200 at the same time. Two combining holes 114 are disposed on two opposite corners of the two plates 111 respectively, and the quantity of the combining holes 114 is not limited to this embodiment. The combining hole 114 of one plate 111 has an embedding portion 1141, and an embedding segment 131 with a diameter slightly smaller than body size is disposed on an end of the pin 130. One end of the pin 130 having the embedding segment 131 penetrates the combining hole 114 and the heat sink fan 200, and is embedded into the embedding portion 1141, such that the two plates 111 are adhered to two opposite sides of the heat sink fan 200 respectively, and the heat sink fan 200 is fixed in the accommodation region. The user only needs to directly combine the cradle 110 with the installed heat sink fan 200 and the fastener 120 fixed on the case 310, so as to fix the heat sink fan 200 on the case 310 of the electronic device 300 directly, and to greatly save the assembling and the disassembling time and steps.

In addition, a clipping portion 115 extends on the other side of one plate 111 opposite to the accommodation region. When the cradle 110 and the fastener 120 clamp with each other for fixing, the clipping portion 115 clips an electrical connection port 320 at the same time, thereby increasing the holding force of the cradle 110 fixed on the case 310, so as to prevent the cradle 110 from loosing from the fastener 120.

Figure 3:
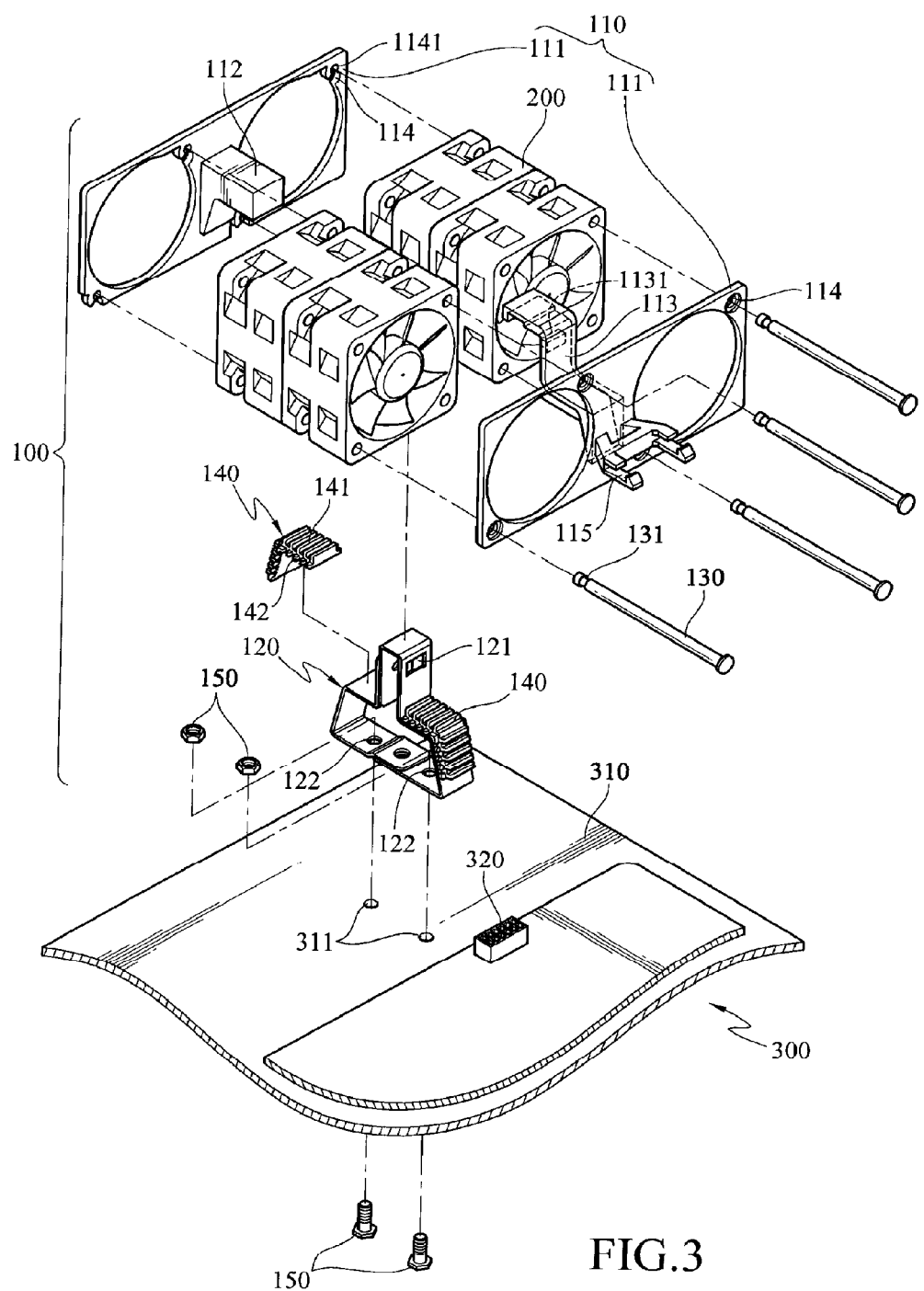
FIG. 3 is an exploded view of a second embodiment of the present invention.
Figure 4:
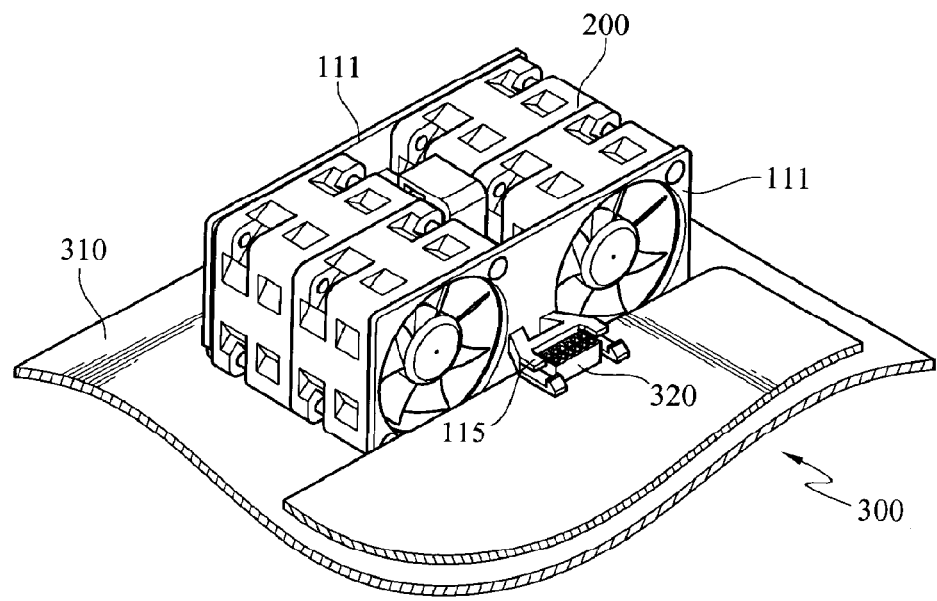
FIG. 4 is a perspective view of the second embodiment of the present invention.
Figure 5:
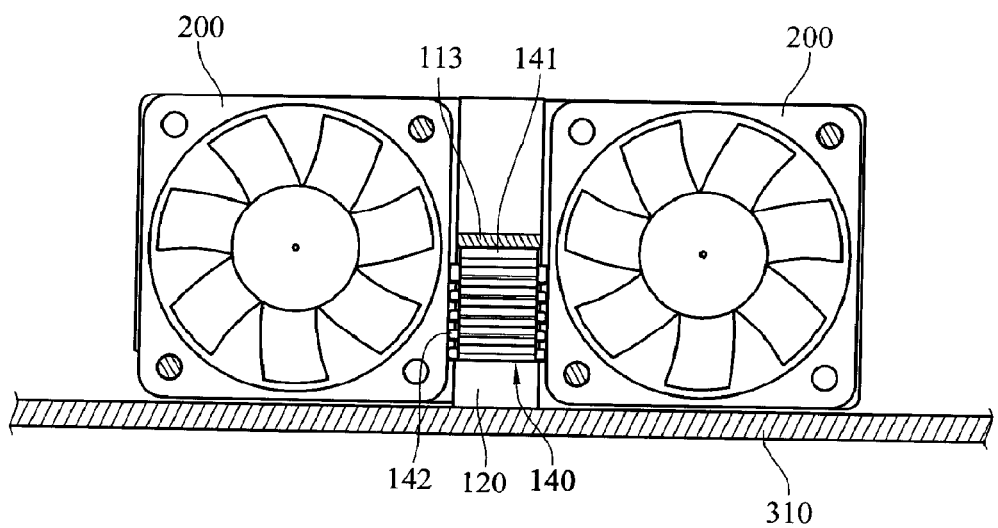
FIG. 5 is a cross-sectional view of the second embodiment of the present invention.

FIG. 3 to FIG. 5 are perspective views of a second embodiment of the present invention. For the fixing frame 100 of the second embodiment of the present invention, through the design of the positions of the combining portion 112 and the latching portion 113, at least two heat sink fans 200 are correspondingly accommodated in the cradle 110. However, those skilled in the art can increase the quantity of the combining portion 112 and the latching portion 113 according to the practical requirement, such that the cradle 110 can accommodate more heat sink fans, which is not limited by the embodiments provided in the present invention.

The fixing frame 100 of the second embodiment of the present invention includes a cradle 110, a fastener 120, a plurality of combining pins 130, and two shock absorbers 140. The shock absorbers 140 are made of rubber material. The shock absorbers 140 are disposed on upper side edge of the fastener 120, and slightly protrude relative to outer edge of the fastener 120. The shock absorber 140 has a plurality of first shock absorbing portions 141 and a plurality of second shock absorbing portions 142. The first shock absorbing portions 141 protrudes on a surface abutting the combining portion 112 and the latching portion 113, the second shock absorbing portions 142 protrudes on a surface abutting the heat sink fan 200, thereby increasing the deformable amount of the shock absorber 140, and enhancing shocking energy absorbing effect of the shock absorber 140.

Referring to FIG. 3 to FIG. 5, when the cradle 110 with the installed heat sink fan 200 clamps with the fastener 120 for fixing, the first shock absorbing portions 141 contact with the combining portions 112 and the latching portion 113, and the second shock absorbing portions 142 contact with the heat sink fan 200, so as to absorb the shocking energy conducting from the outside to the fixing frame 100, or to absorb the shocking energy generated when the heat sink fan 200 operates.

In the fixing frame provided by the present invention, the accommodation region and the clamping region are partitioned by the combining portion and the latching portion for accommodating and fixing at least one heat sink fan in the bracket. The cradle with the installed heat sink fan is fixed on the case through the clamping and fixing between the clamping region and the fastener, thereby greatly saving the assembling and disassembling time and steps for the heat sink fan.

In addition, the shock absorbers of the present invention further provide shock absorbing protection function, so as to prevent the fixing frame and the heat sink fan from being affected by the shocking energy to result in the structural damage or over high noise.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fixing frame, for fixing at least one heat sink fan on a case of an electronic device, comprising:
   a bracket, having two plates, wherein the two plates are disposed oppositely and spaced by a distance, a combining portion is disposed at one side of one of the plates, and a latching portion is disposed at one side of the other plate, such that at least one accommodation region is partitioned from the cradle for accommodating the heat sink fan, and the latching portion and the combining portion are combined with each other to form a clamping region; and
   at least one fastener, disposed on the case and clamped in the clamping region, such that the cradle is fixed on the case.

2. The fixing frame as claimed in claim 1, wherein the fastener has a buckling hole, the latching portion has a hook, and the hook buckles with the buckling hole, such that the fastener is fixed at the clamping region.

3. The fixing frame as claimed in claim 1, wherein at least one combining hole is respectively disposed on the two plates, and by penetrating at least one pin through the combining holes, the two plate parts are adhered to two opposite sides of the heat sink fan, such that the heat sink fan is fixed in the accommodation region.

4. The fixing frame as claimed in claim 3, wherein one of the combining holes has an embedding portion, an embedding segment is disposed on one end of the pin, and the embedding segment is embedded in the embedding portion, such that the two plates are adhered to two opposite sides of the heat sink fan.

5. The fixing frame as claimed in claim 1, further comprising at least one shock absorber disposed on the fastener for absorbing a shocking energy.

6. The fixing frame as claimed in claim 5, wherein the shock absorber has a plurality of first shock absorbing portions protruding on a surface abutting the combining portion and the latching portion.

7. The fixing frame as claimed in claim 5, wherein the shock absorber has a plurality of second shock absorbing portions protruding on a surface abutting the heat sink fan.

8. The fixing frame as claimed in claim 5, wherein material of the shock absorber is rubber material.

9. The fixing frame as claimed in claim 1, wherein the fastener has at least one locking hole, at least one fixing hole is disposed on the case, and by penetrating at least one locking element through the locking hole to be locked in the fixing hole, the fastener is fixed on the case.

10. The fixing frame as claimed in claim 1, wherein a clipping portion extends on the other side of one of the plates opposite to the accommodation region.

* * * * *